United States Patent
Kreiner et al.

(10) Patent No.: US 11,867,375 B2
(45) Date of Patent: Jan. 9, 2024

(54) RADIATION-EMITTING SEMICONDUCTOR CHIP, REAR LIGHT FOR A MOTOR VEHICLE, MOTOR VEHICLE, AND OPTICAL DISTANCE MEASUREMENT DEVICE

(71) Applicant: ams-OSRAM International GmbH, Regensburg (DE)

(72) Inventors: Laura Kreiner, Regensburg (DE); Bruno Jentzsch, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 0 days.

(21) Appl. No.: 17/924,778

(22) PCT Filed: May 11, 2021

(86) PCT No.: PCT/EP2021/062484
§ 371 (c)(1),
(2) Date: Nov. 11, 2022

(87) PCT Pub. No.: WO2021/228855
PCT Pub. Date: Nov. 18, 2021

(65) Prior Publication Data
US 2023/0204182 A1 Jun. 29, 2023

(30) Foreign Application Priority Data
May 13, 2020 (DE) .................. 10 2020 112 969.6

(51) Int. Cl.
*F21S 43/00* (2018.01)
*F21S 43/13* (2018.01)
(Continued)

(52) U.S. Cl.
CPC .............. *F21S 43/13* (2018.01); *B60Q 1/302* (2013.01); *G01S 7/4814* (2013.01);
(Continued)

(58) Field of Classification Search
CPC ..... B60Q 1/302; G01S 17/931; G01S 7/4814; H01L 33/0045; H01L 33/46; H01S 5/0287; H01S 5/1085; F21S 43/13
See application file for complete search history.

(56) References Cited

U.S. PATENT DOCUMENTS 7,394,841 B1 * 7/2008 Konttinen ............ G03B 21/204
372/99
2008/0175284 A1 7/2008 Konttimen et al.
(Continued)

FOREIGN PATENT DOCUMENTS

DE 198 07 758 A1 12/1998
DE 101 05 802 A1 8/2002
(Continued)

OTHER PUBLICATIONS

International Search Report issued for corresponding International Patent Application No. PCT/EP2021/062484 dated Aug. 13, 2021, along with an English translation (6 pages).
(Continued)

*Primary Examiner* — Gerald J Sufleta, II
(74) *Attorney, Agent, or Firm* — HAUPTMAN HAM, LLP

(57) ABSTRACT

A radiation-emitting semiconductor chip includes a semiconductor layer sequence having an active layer for generating electromagnetic radiation. The semiconductor chip also includes a reflector at a side surface of the semiconductor layer sequence having a reflector surface facing the semiconductor layer sequence and extending obliquely with respect to the active layer. The semiconductor chip further includes a top surface extending transversely with respect to the reflector surface and having a first emission region. The semiconductor chip additionally includes a further reflector situated opposite the reflector. The semiconductor chip is configured such that electromagnetic radiation generated in
(Continued)

Figure 1:
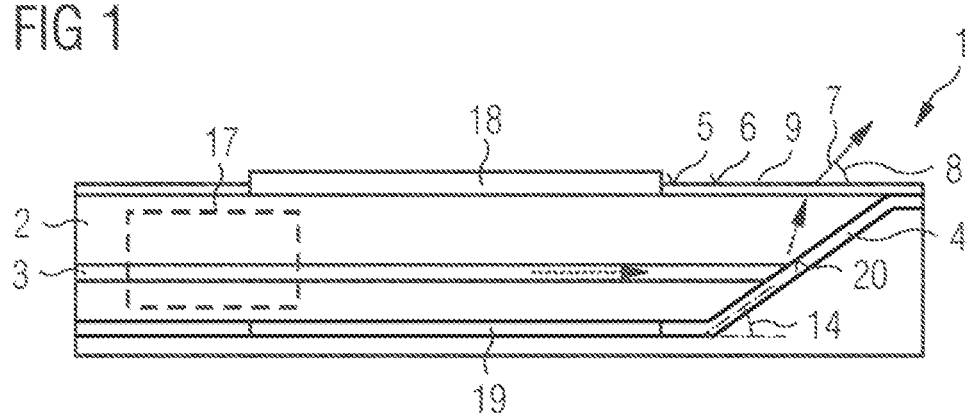

the active layer during operation is reflected by the reflector and emerges from the semiconductor chip via the emission region of the top surface. A main emission direction of the emerging electromagnetic radiation together with the active layer form an emergence angle of between 30° and 80° inclusive.

14 Claims, 4 Drawing Sheets

(51) Int. Cl.
  *G01S 17/931* (2020.01)
  *B60Q 1/30* (2006.01)
  *G01S 7/481* (2006.01)
  *H01L 33/00* (2010.01)
  *H01L 33/46* (2010.01)
  *H01S 5/028* (2006.01)
  *H01S 5/10* (2021.01)
  *F21Y 115/30* (2016.01)

(52) U.S. Cl.
  CPC ........ *G01S 17/931* (2020.01); *H01L 33/0045* (2013.01); *H01L 33/46* (2013.01); *H01S 5/0287* (2013.01); *H01S 5/1085* (2013.01); *F21Y 2115/30* (2016.08)

(56) References Cited

U.S. PATENT DOCUMENTS

| | | |
|---|---|---|
| 2013/0050656 A1 | 2/2013 | Mochizuki |
| 2013/0207139 A1* | 8/2013 | Weidner .................. H01L 33/38 |
| | | 257/91 |
| 2013/0207145 A1* | 8/2013 | Schneider ............... H01L 33/60 |
| | | 257/98 |
| 2015/0221840 A1* | 8/2015 | O'Brien .............. B29C 45/0053 |
| | | 204/192.1 |
| 2017/0054054 A1* | 2/2017 | Bauer ..................... H01L 33/60 |
| 2020/0119242 A1* | 4/2020 | Brick ..................... H01L 33/44 |
| 2020/0158310 A1* | 5/2020 | Brick ..................... G02B 1/113 |

FOREIGN PATENT DOCUMENTS

| | | |
|---|---|---|
| DE | 103 23 860 A1 | 11/2004 |
| DE | 10 2011 050 450 A1 | 11/2012 |
| DE | 10 2018 105 080 A1 | 9/2019 |
| JP | 2015-162566 A | 9/2015 |

OTHER PUBLICATIONS

Written Opinion issued for corresponding International Patent Application No. PCT/EP2021/062484 dated Aug. 13, 2021 (7 pages).

* cited by examiner

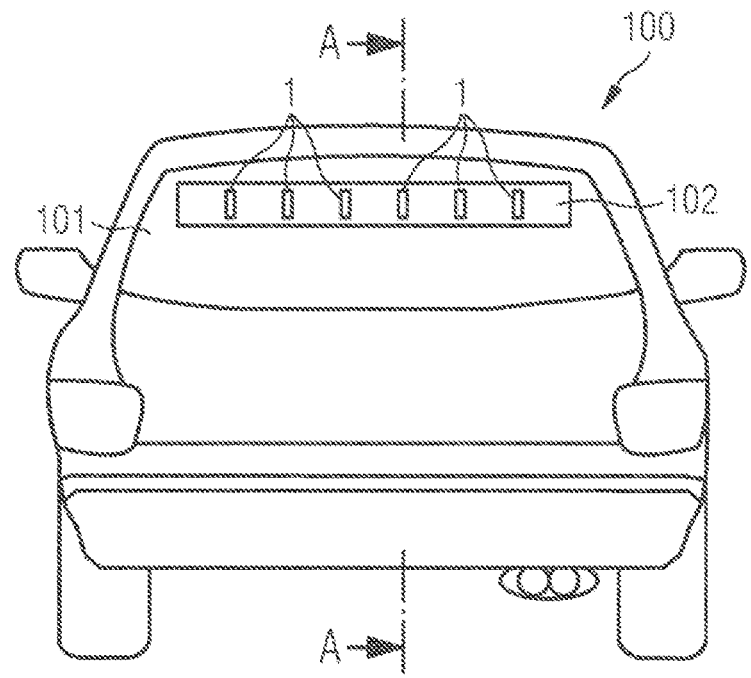
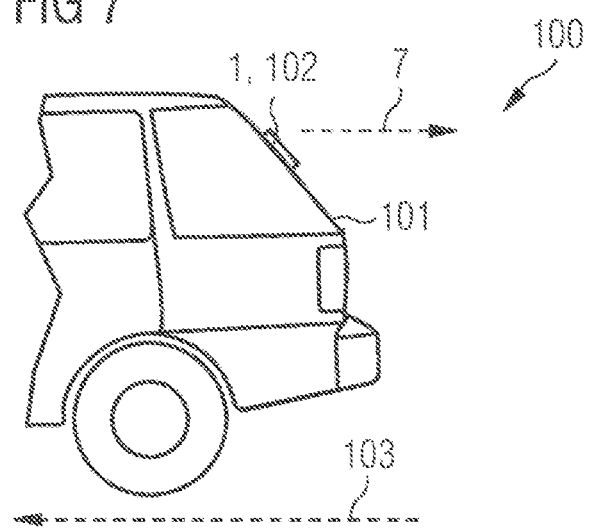

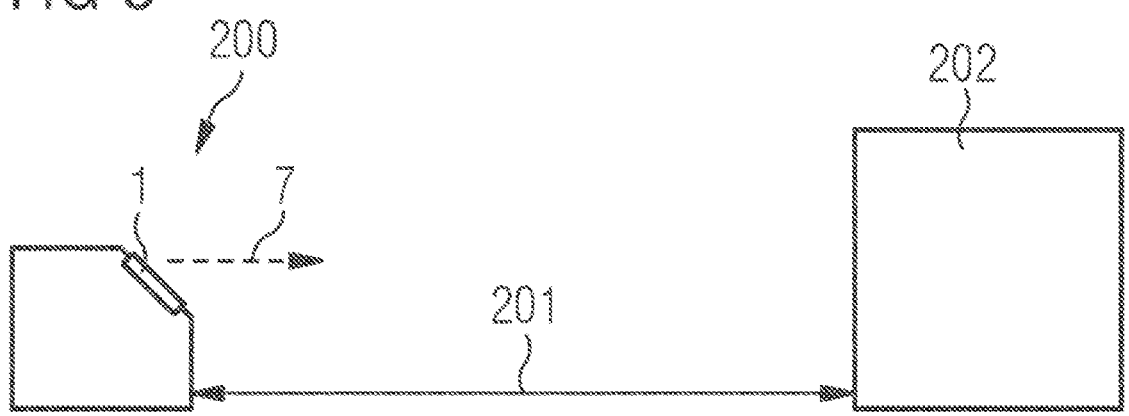

RADIATION-EMITTING SEMICONDUCTOR CHIP, REAR LIGHT FOR A MOTOR VEHICLE, MOTOR VEHICLE, AND OPTICAL DISTANCE MEASUREMENT DEVICE

CROSS REFERENCE TO RELATED APPLICATION

This application is a National Stage of International Application No. PCT/EP2021/062484, filed on May 11, 2021, which designates the United States and was published in Europe, and which claims priority to German Patent Application No. 10 2020 112 969.6, filed on May 13, 2020, in the German Patent Office. Both of the aforementioned applications are hereby incorporated by reference in their entireties.

A radiation-emitting semiconductor chip is specified. Furthermore, a rear light for a motor vehicle, a motor vehicle and a distance measurement device are specified.

One object to be achieved consists in specifying a semiconductor chip which efficiently emits radiation. A further object to be achieved consists in specifying a rear light for a motor vehicle which emits radiation directionally. A further object to be achieved consists in specifying a motor vehicle having such a rear light. Yet another object to be achieved consists in specifying a distance measurement device.

These objects are achieved, inter alia, by the subjects of patent claims 1, 13, 14 and 15. Advantageous configurations and developments are the subject of the dependent patent claims and are furthermore evident from the following description and the drawings.

In accordance with at least one embodiment, the radiation-emitting semiconductor chip comprises a semiconductor layer sequence having an active layer for generating electromagnetic radiation.

The semiconductor layer sequence is based on a III-V compound semiconductor material, for example. The semiconductor material is for example a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, where in each case $0 \leq n \leq 1$, $0 \leq m \leq 1$ and $m+n \leq 1$. In this case, the semiconductor layer sequence can comprise dopants and also additional constituents. For the sake of simplicity, however, only the essential constituents of the crystal lattice of the semiconductor layer sequence are specified, even if these can be replaced and/or supplemented in part by small amounts of further substances.

The active layer of the semiconductor layer sequence includes in particular at least one pn junction and/or at least one quantum well structure in the form of a single quantum well, SQW for short, or in the form of a multi quantum well structure, MQW for short. For example, during operation as intended, the active layer generates electromagnetic radiation in the blue or green or red spectral range or in the UV range or in the IR range.

In accordance with at least one embodiment, the radiation-emitting semiconductor chip comprises a reflector at a side surface of the semiconductor layer sequence having a reflector surface facing the semiconductor layer sequence. The reflector surface extends obliquely with respect to the active layer. In particular, the reflector surface extends at the level of the active layer. "Extending at the level of the active layer" is taken to mean that a main extension plane of the active layer intersects the reflector surface. In particular, the reflector surface together with the main extension plane of the active layer form an angle of between 30° and 60° inclusive or between 35° and 55° inclusive or between 40° and 50° inclusive. The side surface of the semiconductor layer sequence is, in particular, an outer surface of the semiconductor layer sequence that delimits a lateral extent of the semiconductor layer sequence, measured parallel to the semiconductor layer sequence.

The reflector and the reflector surface, respectively, preferably directly adjoin the semiconductor layer sequence and the side surface, respectively. In other words, the side surface of the semiconductor layer sequence then in particular also extends obliquely with respect to the active layer and together with the active layer forms the same setting angle as the reflector surface.

The reflector surface is an outer surface of the reflector facing the semiconductor layer sequence. Preferably, within the scope of production tolerance, the reflector surface is planar and particularly preferably also smooth over its entire extent. By way of example, the root mean square roughness of the reflector surface is at most 10 nm or at most 5 nm or at most 1 nm. In particular, the reflector surface covers the entire side surface or at least 75% of the side surface of the semiconductor layer sequence.

The reflector preferably has a reflectivity of at least 80% or at least 90% or at least 99% for radiation generated in the active layer during operation.

The reflector comprises or consists for example of metal, for example one or more metals selected from: silver, aluminum, nickel, copper, gold. The reflector surface can likewise be composed of metal or it can be formed in an electrically insulating fashion. By way of example, in the case where the reflector comprises at least one metal, an insulation layer is applied between the reflector and the semiconductor layer sequence and electrically insulates the reflector from the semiconductor layer sequence. The insulation layer can be a part of the reflector. The reflector surface is then formed in particular by the insulation layer.

Alternatively or additionally, it is possible for the reflector to comprise a dielectric mirror, in which partial layers composed of a high refractive index material and a low refractive index material are arranged alternately.

In accordance with at least one embodiment, the radiation-emitting semiconductor chip comprises a top surface extending transversely with respect to the reflector surface and having a first emission region. The top surface is, in particular, a surface of the semiconductor chip that is exposed toward the outside. The top surface in particular delimits the semiconductor chip in terms of the vertical extent thereof, measured perpendicular to the main extension plane of the active layer. The top surface can be formed with a semiconductor material. Alternatively, the top surface is formed with a metal and/or a dielectric material. Preferably, the top surface extends parallel to the main extension plane of the active layer.

In particular, the first emission region and the reflector or the reflector surface overlap one another in a projection onto the main extension plane of the active layer.

In accordance with at least one embodiment, the radiation-emitting semiconductor chip is configured such that electromagnetic radiation generated in the active layer during operation is reflected by the reflector. The reflected radiation then emerges from the semiconductor chip via the first emission region of the top surface.

By way of example, the semiconductor layer sequence comprises a propagation region comprising the active layer, and also a first and a second cladding layer, between which the active layer is arranged. During operation as intended, electromagnetic radiation generated in the active layer propagates in the propagation region preferably parallel to the main extension plane of the active layer. In a vertical direction, perpendicular to the main extension plane of the active layer, the propagation region is delimited by the cladding layers. By way of example, the refractive indices of the first cladding layer and of the second cladding layer are matched such that propagation of the radiation parallel to the main extension plane of the active layer is achieved during operation. In particular, the cladding layers each have a lower refractive index than the active layer.

The propagation region adjoins the reflector, in particular, and is delimited by the latter in a lateral direction. The propagation region can project beyond the active layer in a lateral direction. Radiation that propagates in the propagation region is reflected in the direction of the top surface by the reflector. The radiation then impinges on the emission region of the top surface, via which emission region it emerges from the semiconductor chip.

In accordance with at least one embodiment, the semiconductor chip is configured such that a main emission direction of the emerging electromagnetic radiation together with the active layer form an emergence angle of between 30° and 80° inclusive. In particular, the emergence angle is between 40° and 70° inclusive. In so far as an angle formed with the active layer is mentioned here and hereinafter, this is taken to mean, in particular, that the angle is measured relative to the main extension plane of the active layer.

An angle between the main emission direction and a surface normal of the emission region is in particular between 10° and 60° inclusive or between 20° and 50° inclusive.

The main emission direction is the direction along which the radiation emerging from the first emission region has its intensity maximum.

In at least one embodiment, the radiation-emitting semiconductor chip comprises a semiconductor layer sequence having an active layer for generating electromagnetic radiation. Furthermore, the semiconductor chip comprises, at a side surface of the semiconductor layer sequence, a reflector having a reflector surface facing the semiconductor layer sequence and extending obliquely with respect to the active layer, and also a top surface extending transversely with respect to the reflector surface and having a first emission region. The semiconductor chip is configured such that electromagnetic radiation generated in the active layer during operation is reflected by the reflector and emerges from the semiconductor chip via the emission region of the top surface. In this case, a main emission direction of the emerging electromagnetic radiation together with the active layer form an emergence angle of between 30° and 80° inclusive.

A radiation-emitting semiconductor chip described here is based on the following technical distinctive features, inter alia. In many applications of radiation-emitting semiconductor chips, it is advantageous if the main emission direction forms an angle with the top surface of the semiconductor chip. This may be the case if a surface on which the semiconductor chip is mounted is inclined relative to the desired main emission direction. This cannot be achieved satisfactorily in the case of conventional radiation-emitting semiconductor chips having a Lambertian emission characteristic.

The present invention makes use of the concept of using a semiconductor chip based on a waveguide principle. That is to say that radiation generated during operation is firstly guided within the semiconductor layer sequence of the semiconductor chip, for example in a direction parallel to the main extension plane of the active layer. Via a reflector having a reflector surface that is inclined relative to the main extension plane of the active layer, radiation emerges from the semiconductor chip with a desired emergence angle during operation. Advantageously, virtually the entire radiation generated during operation can thus be utilized in the application. Furthermore, guiding the radiation within the semiconductor layer sequence allows the semiconductor chip to be configured compactly.

The semiconductor chip disclosed here is suitable for example as a radiation source in a spotlight or a headlight or a rear light of a vehicle or in a projector. The semiconductor chip is likewise suitable as a radiation source for sensor technology applications, for example of a distance measurement device or of a speed measurement device.

In accordance with at least one embodiment, the emergence angle is between 55° and 65° inclusive. Preferably, the emergence angle is 60° with a maximum deviation of 2° or of 1°.

In accordance with at least one embodiment, the radiation-emitting semiconductor chip comprises a further reflector situated opposite the reflector and having a further reflector surface facing the semiconductor layer sequence. The further reflector surface extends transversely with respect to the active layer at the level of the active layer. The further reflector is preferably arranged at a further side surface of the semiconductor layer sequence. The further side surface is, in particular, an outer surface of the semiconductor layer sequence that is situated opposite the side surface at which the reflector is arranged. In particular, all features which are disclosed here and hereinafter for the reflector and the reflector surface, respectively, are also disclosed for the further reflector and the further reflector surface, respectively, and vice versa. The reflector and the further reflector are embodied integrally with one another, for example, and can be part of a molded body that molds laterally around the semiconductor layer sequence.

In accordance with at least one embodiment, the semiconductor chip is configured such that electromagnetic radiation generated in the active layer during operation is reflected by the further reflector. In particular, the radiation is reflected in the direction of the top surface by the further reflector.

Alternatively, it is also possible for the further reflector to reflect the radiation in the direction from which the latter is incident. In this case, the further reflector surface is, in particular, perpendicular to the main extension plane of the active layer.

In accordance with at least one embodiment, the top surface comprises a second emission region, which is separated and spaced apart from the first emission region. In particular, the second emission region and the further reflector or the further reflector surface overlap one another in a projection onto the main extension plane of the active layer.

For example, the first emission region is separated from the second emission region by a third region of the top surface. The third region comprises a metal, in particular, and can be configured as an electrode. By way of example, the semiconductor layer sequence is energized via the electrode during operation as intended.

In accordance with at least one embodiment, the semiconductor chip is configured such that radiation reflected by the further reflector during operation emerges from the semiconductor chip via the second emission region.

In accordance with at least one embodiment, a main emission direction of the radiation emerging via the second emission region is parallel to the main emission direction of the radiation emerging via the first emission region. "Parallel" here means that the main emission directions form an angle with one another of at most 5° or at most 2°. In particular, the main emission direction of the radiation emerging in the second emission region together with the active layer form an emergence angle that is in the same range as was specified above for the emergence angle of the main emission direction of the radiation emerging in the first emission region.

In accordance with at least one embodiment of the radiation-emitting semiconductor chip, the reflector surface together with the active layer form a setting angle of between 40° and 44° inclusive. By way of example, the setting angle is 42°. Furthermore, the further reflector surface together with the active layer form a further setting angle of between 47° and 51° inclusive. By way of example, the further setting angle is 49°. Alternatively, it is possible for the setting angle to be 49° and for the further setting angle to be 42°.

With such a choice of the setting angles, electromagnetic radiation whose main emission directions are parallel or substantially parallel to one another can be coupled out via the first emission region and via the second emission region. Preferably, the main emission directions of the emerging radiation are each at an angle of about 30° relative to the active layer. By way of example, the radiation emerging from the first emission region is refracted during operation. Preferably, the setting angles are chosen such that taking account of the refraction during radiation emergence, the main emission direction together with the active layer form a desired angle, for example 30°.

In accordance with at least one embodiment, the top surface comprises a reflection region. By way of example, in the reflection region the top surface has a reflectivity of at least 80% or at least 90% or at least 99% for electromagnetic radiation generated in the active layer.

This is taken to mean that at least 80% or at least 90% or at least 99% of the radiation that impinges on the reflection region during operation is reflected. The reflection region is formed for example from metal, such as silver or aluminum or gold or a mixture of these metals. Alternatively, the reflection region can be formed from one or more dielectric materials, for example in the form of a Bragg mirror. In particular, the reflection region and the further reflector or the further reflector surface overlap one another in a projection onto the main extension plane on the active layer.

In accordance with at least one embodiment, the semiconductor chip is configured such that radiation reflected by the further reflector during operation is reflected back onto the reflector in the reflection region. Preferably, no radiation emerges from the semiconductor chip via the reflection region during operation. That is to say that radiation that propagates parallel to the active layer is reflected in the direction of the reflection region at the further reflector. At the reflection region, this radiation is then reflected back to the further reflector.

In accordance with at least one embodiment of the radiation-emitting semiconductor chip, the further reflector surface together with the active layer form a further setting angle of between 42° and 47° inclusive. By way of example, the further setting angle is 45°. In the case where a reflection region that overlaps the further reflector or the further reflector surface in a projection onto the active layer is formed at the top surface, electromagnetic radiation reflected by the reflection region, with a further setting angle of 45°, can be reflected back into the active layer and parallel to the active layer. Thus, during operation, the radiation reflected at the reflection region can be guided along the active layer via the further reflector and can be coupled out of the semiconductor chip via the first emission region after reflection at the reflector. Radiation loss can thus be reduced and the efficiency of the semiconductor chip can be increased.

In accordance with at least one embodiment of the radiation-emitting semiconductor chip, the first emission region of the top surface is formed by an antireflection region. The antireflection region is configured to transmit at least 99% of the radiation impinging on it from the direction of the reflector during operation. Preferably, the antireflection region transmits at least 99.5% or 99.9% of the radiation impinging on it during operation. The antireflection region is preferably formed by an antireflection coating. The antireflection coating comprises in particular at least one dielectric material. For example, the antireflection coating is constructed from a multiplicity of dielectric layers in a layer stack. The layer stack is preferably configured in such a way that the largest possible proportion of the incident electromagnetic radiation is transmitted by the antireflection coating. By way of example, the individual layers are chosen accordingly with regard to their refractive index and/or their layer thicknesses, measured perpendicular to their main extension plane. The antireflection coating comprises for example at least one of the following materials: $SiO_2$, SiN, SiON, $MgF_2$, $Nb_2O_5$, $TiO_2$, $ZrO_2$, $HfO_2$, $Al_2O_3$, $Ta_2O_5$, ZnO. By way of example, the layer thickness is in each case between 10 nm and 500 nm inclusive. The arrangement of the antireflection coating enables the semiconductor chip to be configured particularly efficiently since a particularly high percentage of the radiation impinging on the emission region emerges through the emission region.

In accordance with at least one embodiment, the second emission region of the top surface is formed by an antireflection region configured to transmit at least 99% of the radiation impinging on it from the direction of the further reflector during operation. In particular, all features disclosed here and hereinafter for the antireflection region of the first emission region are also disclosed for the antireflection region of the second emission region, and vice versa.

In accordance with at least one embodiment of the radiation-emitting semiconductor chip, an absorption structure is arranged at a side of the active layer situated opposite the reflector. The absorption structure is configured to absorb radiation generated in the active layer during operation. The absorption structure is preferably formed in the semiconductor layer sequence. By way of example, the absorption structure, like the active layer, comprises at least one pn junction or a quantum well structure. In particular, the absorption structure has a band gap corresponding to a band gap of the active layer. In contrast to the active layer, the absorption structure is preferably not energized. Electromagnetic radiation generated in the active layer during operation is thus absorbed in the absorption layer.

Alternatively or additionally, it is possible for the absorption structure to comprise a material that has an absorbing effect for the electromagnetic radiation generated in the active layer during operation.

In accordance with at least one embodiment of the radiation-emitting semiconductor chip, the semiconductor chip is a superluminescence diode chip (SLED). In particular, the superluminescence diode chip has an increased brightness and/or an increased luminous flux by comparison with a conventional light emitting diode chip (LED). Electromagnetic radiation generated in the active layer can be amplified in the propagation region. By way of example, for this purpose, a lateral extent of the semiconductor layer sequence, for example between the two side surfaces with a reflector arranged at each of them, can be chosen to be particularly large. In addition, the semiconductor chip can be operated at a high current density. In particular, a superluminescence diode chip has no resonator, in contrast to a laser diode.

Radiation emitted by a superluminescence diode chip during operation is incoherent, in particular. The semiconductor chip is configured for example such that radiation emitted by a superluminescence diode chip has a wide emission spectrum. This should be understood to mean that the emission spectrum preferably has a peak at a peak wavelength with a full width at half maximum (FWHM) of at least 50 nm or at least 100 nm or at least 150 nm. Alternatively or additionally, the full width at half maximum can be at most 200 nm.

In accordance with at least one embodiment of the radiation-emitting semiconductor chip, the semiconductor chip is a laser diode chip. In particular, the laser diode chip is configured such that it emits laser radiation during operation. By way of example, an operating point of the semiconductor chip is chosen such that a gain in the propagation region of the semiconductor layer sequence is great enough that laser radiation is emitted by the semiconductor chip. By way of example, the semiconductor chip is fed such a high current density that laser radiation is emitted. In the case where the semiconductor chip is configured such that radiation is at least partly reflected back into the propagation region by one of the reflectors during operation, the semiconductor chip has a resonator. However, it is possible for the semiconductor chip to be operated in such a way that it emits laser radiation even without a resonator.

In particular, the emitted radiation is coherent and monochromatic. The laser radiation has for example a spectrum having a, preferably exactly one, peak. The peak has in particular a full width at half maximum of at most 10 nm or at most 5 nm.

A laser diode chip described here preferably finds application in the field of sensor technology.

Furthermore, a rear light for a motor vehicle and a motor vehicle having such a rear light are specified. In particular, a radiation-emitting semiconductor chip disclosed here can be used as radiation source for the rear light. That is to say that all features which are disclosed in connection with the rear light and which relate to the semiconductor chip are likewise disclosed for the semiconductor chip, and vice versa.

In accordance with at least one embodiment of the rear light for a motor vehicle, said rear light comprises at least one radiation-emitting semiconductor chip described here. The semiconductor chip is preferably a superluminescence diode chip. In particular, the semiconductor chip is configured such that it emits radiation in the red wavelength range during operation.

In accordance with at least one embodiment of the motor vehicle, the latter comprises a rear window and a rear light. The rear light is arranged on the rear window. In particular, the rear light comprises at least one radiation-emitting semiconductor chip described here. The motor vehicle is configured in particular in such a way that electromagnetic radiation emitted by the semiconductor chip of the rear light during operation is emitted parallel or antiparallel to a travel direction of the motor vehicle.

By way of example, the rear window forms an angle with the travel direction of the motor vehicle. By way of example, the rear light, in particular the radiation-emitting semiconductor chip, is directly arranged on the rear window or integrated in the rear window. Preferably, the semiconductor chip has an emergence angle which compensates for the inclination of the rear window such that the main emission direction of the radiation emitted by the semiconductor chip is parallel or antiparallel to the travel direction of the vehicle. Vehicles following the motor vehicle can thus perceive the rear light particularly well.

Furthermore, an optical distance measurement device is specified. In particular, a semiconductor chip disclosed here can be used as radiation source for the distance measurement device. That is to say that all features which are disclosed in connection with the radiation source and which relate to the semiconductor chip are likewise disclosed for the semiconductor chip, and vice versa.

In accordance with at least one embodiment of the optical distance measurement device for determining a distance to an object, said device comprises a radiation-emitting semiconductor chip. Preferably, the semiconductor chip is configured such that it emits laser radiation during operation. The emitted laser radiation is preferably in the IR range. By way of example, the optical distance measurement device is a so-called lidar system.

The optical distance measurement device is configured such that during operation laser radiation is directed at an object to which a distance is intended to be determined. The radiation emitted by the distance measurement device is then at least partly reflected by the object and detected by the optical distance measurement device. For this purpose, the optical distance measurement device can comprise a detection device. The distance to the object can then be calculated from a time period between the emission of the radiation and the detection of the radiation reflected back. In particular, this involves a so-called time-of-flight measurement.

If the object is in motion, then a speed of the object can also be determined by repeatedly carrying out the distance measurement.

A distance measurement device described here is suitable for example for application in a motor vehicle or a cellular phone.

Further advantages, advantageous configurations and developments of the radiation-emitting semiconductor chip will become apparent from the following exemplary embodiments illustrated in association with the schematic drawings. Elements that are identical, of identical type and act identically are provided with the same reference signs in the figures. The figures and the size relationships of the elements illustrated in the figures among one another should not be regarded as true to scale, in principle. Rather, individual elements may be illustrated with an exaggerated size in order to enable better illustration and/or in order to afford a better understanding.

Figure 2:
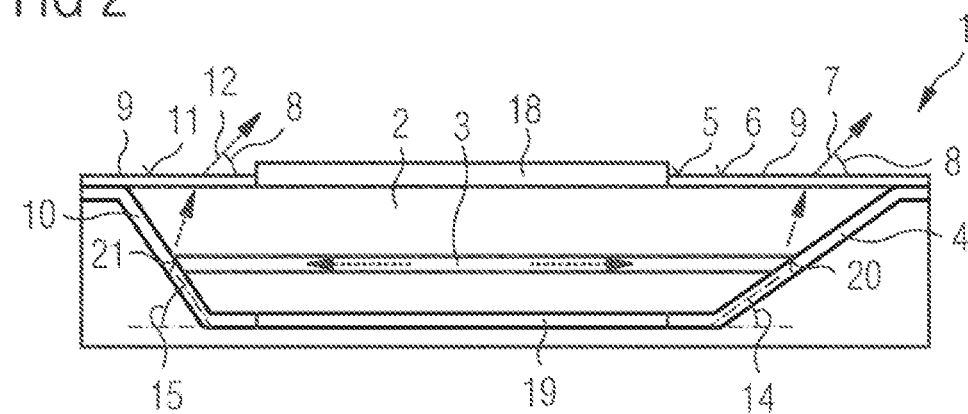
Figure 3:
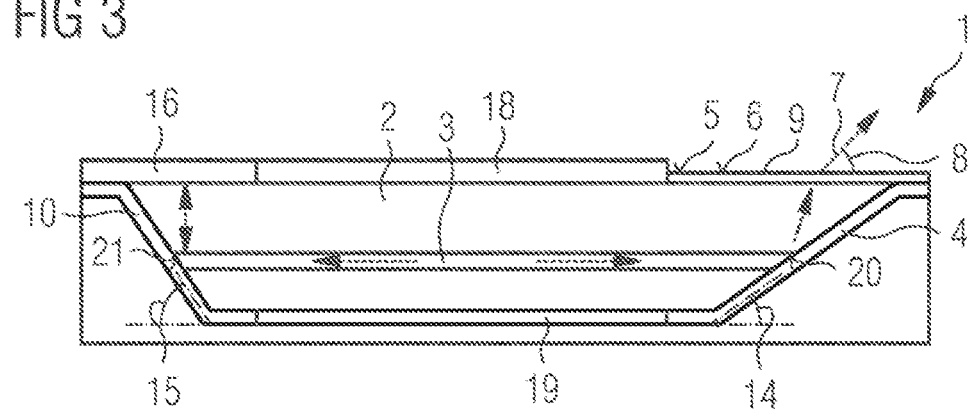
Figure 4:
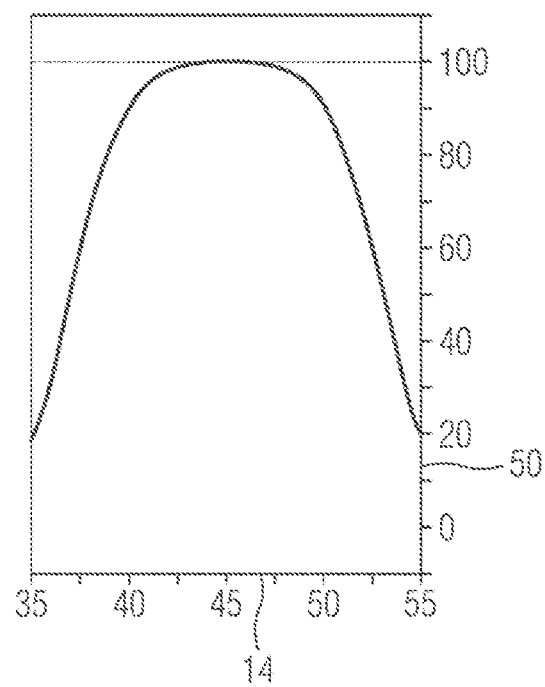
Figure 5:
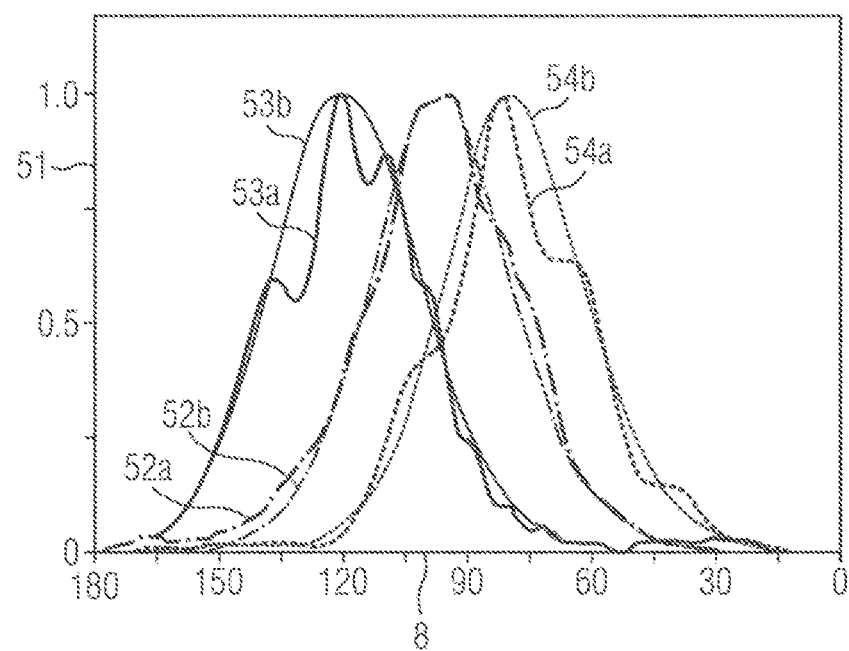

In the Figures:

FIGS. 1 to 3 show exemplary embodiments of a radiation-emitting semiconductor chip in sectional view, FIG. 4 shows the transmissivity of an antireflection coating, FIG. 5 shows intensity distributions of radiation emitted by a radiation-emitting semiconductor chip, FIGS. 6 and 7 show one exemplary embodiment of a motor vehicle in different views, FIG. 8 shows one exemplary embodiment of an optical distance measurement device.

The radiation-emitting semiconductor chip 1 in FIG. 1 comprises a semiconductor layer sequence 2 having an active layer 3. Furthermore, the semiconductor chip 1 comprises a reflector 4 having a reflector surface 20 extending obliquely with respect to the main extension plane of the active layer 3. The reflector surface 20 and the main extension plane of the active layer 3 form a setting angle 14. The reflector 4 or the reflector surface 20 is in direct contact with a side surface of the semiconductor layer sequence 2. The reflector 4 comprises for example at least one metal and/or a Bragg mirror.

The semiconductor chip 1 comprises a top surface 5 having a first emission region 6. The first emission region 6 is formed by an antireflection coating 9.

Furthermore, the semiconductor chip 1 comprises a first electrode 18 and a second electrode 19. The first electrode 18 forms a third region of the top surface 5. The second electrode 19 is arranged at a side of the semiconductor layer sequence 2 situated opposite the top surface.

During operation as intended, the semiconductor layer sequence 2 is energized via the two electrodes 18, 19. In this case, electromagnetic radiation is generated in the active layer 3. During operation, the electromagnetic radiation propagates along the main extension plane of the active layer 3 and is reflected in the direction of the top surface 5 by the reflector 4. The electromagnetic radiation then emerges from the semiconductor chip 1 through the first emission region 6. This is illustrated with the aid of the arrows in FIG. 1. A main emission direction 7 of the radiation has an emergence angle 8 upon emergence from the semiconductor chip 1. The emergence angle 8 is measured relative to the main extension plane of the active layer 3. FIG. 1 shows the emergence angle 8 relative to the top surface 5, which is because the top surface 5 extends parallel to the main extension plane of the active layer 3.

Through the antireflection coating 9 configured to transmit at least 99%, preferably at least 99.8%, of the radiation impinging on it during operation, substantially all of the radiation reflected by the reflector 4 can emerge from the semiconductor chip 1. The antireflection coating 9 comprises for example a layer stack having a multiplicity of layers composed of dielectric material. The emergence angle 8 can be influenced by means of the setting angle 14. In FIG. 1, the setting angle 14 is 42°, for example, and the emergence angle 8 is 30°, for example.

An absorption structure 17 is arranged at a side of the active layer 3 situated opposite the reflector 4. The absorption structure 17 is configured to absorb radiation generated in the active layer 3 during operation as intended. The absorption structure 17 comprises substantially the same semiconductor material as the semiconductor layer sequence 2 and, like the active layer 3, has a pn junction or a quantum well structure. In particular, the absorption structure 17 has a band gap corresponding to the band gap of the active layer 3. Radiation generated in the active layer 3 during operation is thus absorbed by the absorption structure 17.

The semiconductor chip 1 in FIG. 2 exhibits substantially the same features as the semiconductor chip 1 in FIG. 1 with the difference that the semiconductor chip 1 in FIG. 2 has a further reflector 10 at a side situated opposite the reflector 4. The further reflector 10 has a further reflector surface 21 having a setting angle 15 relative to the active layer 3. The further reflector 10 is formed in particular with the same material as the reflector 4.

Furthermore, the semiconductor chip 1 in FIG. 2 has a second emission region 11. The second emission region 11 of the top surface 5 is formed by an antireflection coating 9 having substantially the same features as the antireflection coating 9 of the first emission region 6.

The semiconductor chip 1 is configured such that electromagnetic radiation generated in the active layer 3 during operation is directed in the direction of the second emission region 11 by the further reflector 10. This radiation emerges from the semiconductor chip 1 via the second emission region 11. A main emission direction 12 of the radiation emitted via the second emission region 11 is in this case parallel or substantially parallel to the main emission direction 7 of the electromagnetic radiation emitted in the first emission region 6. In particular, the main emission direction 12 and the main extension plane of the active layer 3 form the same emergence angle 8 as the main emission direction 7. Preferably, the further setting angle 15 is different than the setting angle 14. The further setting angle 15 is 49°, for example.

In the case of the exemplary embodiment in FIG. 3, the radiation-emitting semiconductor chip 1 has substantially the same features as the radiation-emitting semiconductor chip 1 in FIG. 2. In contrast to FIG. 2, in the case of the semiconductor chip 1 in FIG. 3, the top surface 5 has a reflection region 16 instead of the second emission region 11. The reflection region 16 is formed for example with a material configured to reflect at least 95% or at least 99% of the incident radiation. The setting angle 15 is preferably 45° with a maximum deviation of 2°. During operation as intended, radiation is reflected in the direction of the reflection region 16 by the further reflector 10. This radiation is reflected back by the reflection region 16 and impinges on the active layer 3 again via the further reflector 10. It is thus possible to amplify radiation in the active layer 3, whereby the brightness of the radiation-emitting semiconductor chip 1 is increased.

FIG. 4 shows the transmissivity 50 of an antireflection coating 9 in percent as a function of the setting angle 14. An antireflection coating 9 having such a transmissivity 50 can be used in the case of one of the semiconductor chips 1 in FIG. 1, 2 or 3. In a range of the setting angle 14 of between about 43° and about 47°, the antireflection coating 9 has almost 100% transmission. That is to say that almost the entire electromagnetic radiation impinging on the antireflection coating 9 is transmitted. For setting angles 14 that are at least 40° and at most 50°, the transmissivity is still about at least 80%. For setting angles 14 that are greater than 50° or less than 40°, the transmissivity decreases greatly. In the case of a setting angle 14 of 35° or 55°, the transmissivity is about 20%, for example. The transmissivity 50 of the antireflection coating 9 can be influenced by adapting the dielectric materials and/or thicknesses of the layers of the layer stack of the antireflection coating 9. By way of example, the transmissivity 50 can deviate from that shown in FIG. 4 in such a way that the maximum of the transmission, i.e. almost 100% transmission, is in the case of the setting angle 14 in FIG. 1.

FIG. 5 shows the normalized intensity 51 of the electromagnetic radiation emitted by a semiconductor chip 1, for example a semiconductor chip 1 in one of FIGS. 1 to 3, for various setting angles 14 as a function of an emergence angle 8. The intensity 51 is normalized to its maximum value, such that the maximum intensity has the value 1. The curve 53a shows a measurement curve 53a for the angle-resolved intensity 51 of a radiation-emitting semiconductor chip 1 in which the setting angle 14 is about 50°. The curve 53b shows the result of a computer simulation of such a semiconductor chip 1. The maximum of the angle-resolved intensity distribution is approximately 120° for the measured intensity 51 (curve 53a) and the intensity 51 determined from the simulation (curve 53b). This intensity maximum marks the main emission direction 7 of the emitted electromagnetic radiation. In so far as expressions such as "about" or "approximately" are used here and hereinafter, this should be understood to mean that a maximum deviation from the value specified after "about" or "approximately" is at most 2°.

The measurement curve 52a shows the intensity distribution of a semiconductor chip 1 in which the setting angle 14 is about 45°. The simulation curve 52b shows the simulation corresponding thereto. The maximum of the intensity 51 of the curves 52a and 52b is at approximately 90°. The main emission direction 7 is thus perpendicular to the main extension plane of the active layer 3.

The measurement curve 54a shows an angle-resolved intensity distribution for a semiconductor chip 1 in which the setting angle 14 is approximately 43°. The simulation curve 54b shows the result of an associated computer simulation. The intensity 51 has its maximum at an emission angle 8 of about 15°.

The motor vehicle 100 is shown in a rear view in FIG. 6. The motor vehicle 100 has a rear window 101, on which a rear light 102 is arranged. By way of example, the rear light 102 is integrated in the rear window 101. The rear light 102 comprises a plurality of radiation-emitting semiconductor chips 1. The semiconductor chip 1 is preferably a superluminescence diode chip that emits radiation in the red wavelength range during operation. By way of example, the semiconductor chip 1 is one in accordance with FIGS. 1 to 3.

FIG. 7 shows the motor vehicle 100 from FIG. 6 in a sectional view along a sectional plane A-A. The rear window 101 forms an acute angle with a travel direction 103 of the motor vehicle 100. The semiconductor chip 1 has a main emission direction 7 which forms an emergence angle 8 with a main extension plane of the active layer of the semiconductor chip 1. In particular, the emergence angle 8 is chosen in such a way that the main emission direction 7 is antiparallel to the travel direction 103. The rear light 102 can thus illuminate particularly efficiently a region lying behind the motor vehicle 100.

The optical distance measurement device 200 in FIG. 8 comprises a radiation-emitting semiconductor chip 1 that preferably emits laser radiation in the IR range during operation. By way of example, the semiconductor chip 1 is a semiconductor chip 1 in accordance with one of FIGS. 1 to 3. The distance 201 to an object 202 can be determined by means of the distance measurement device 200. The main extension plane of the active layer of the semiconductor chip 1 forms an acute angle with a connecting line marking the shortest distance 201 between the object 202 and the distance measurement device 200. The semiconductor chip 1 has a main emission direction 7 which forms an emergence angle with the main extension plane of the active layer. In particular, the emergence angle is chosen such that the main emission direction 7 is parallel to the connecting line between the object 202 and the optical distance measurement device 200. The optical distance measurement device 200 is a so-called lidar system, in particular.

During operation as intended, the emitted radiation is reflected back in the direction of the distance measurement device 200 at the object 202 and is detected by the distance measurement device 200. The distance 201 to the object 202 can then be determined from the time of flight of the laser radiation between emission and detection of the radiation reflected back.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 Radiation-emitting semiconductor chip
2 Semiconductor layer sequence
3 Active layer
4 Reflector
5 Top surface
6 First emission region
7 Main emission direction
8 Emergence angle
9 Antireflection coating
10 Further reflector
11 Second emission region
12 Main emission direction
14 Setting angle
15 Further setting angle
16 Reflection region
17 Absorption structure
18 First electrode
19 Second electrode
20 Reflector surface
21 Further reflector surface
50 Transmissivity
51 Normalized intensity
52a, 53a, 54a Measurement curves
52b, 53b, 54b Simulation curves
100 Motor vehicle
101 Rear window
102 Rear light
103 Travel direction
200 Optical distance measurement device
201 Distance
202 Object

The invention claimed is:
1. A radiation-emitting semiconductor chip comprising
a semiconductor layer sequence having an active layer for generating electromagnetic radiation,
a reflector at a side surface of the semiconductor layer sequence having a reflector surface facing the semiconductor layer sequence and extending obliquely with respect to the active layer,
a further reflector situated opposite the reflector and having a further reflector surface facing the semiconductor layer sequence, said further reflector surface extending transversely with respect to the active layer at a level of the active layer, and
a top surface extending transversely with respect to the reflector surface and having a first emission region, wherein
the semiconductor chip is configured such that electromagnetic radiation generated in the active layer during operation is reflected by the reflector and emerges from the semiconductor chip via the first emission region of the top surface, the semiconductor chip is configured such that electromagnetic radiation generated in the active layer during operation is reflected by the further reflector, the reflector and the further reflector are embodied integrally with one another, and a main emission direction of the emerging electromagnetic radiation together with the active layer form an emergence angle of between 30° and 80° inclusive.

2. The radiation-emitting semiconductor chip as claimed in claim 1, wherein the emergence angle is between 55° and 65° inclusive.

3. The radiation-emitting semiconductor chip as claimed in claim 1, wherein the top surface comprises a second emission region, which is separated and spaced apart from the first emission region, the semiconductor chip is configured such that radiation reflected by the further reflector during operation emerges from the semiconductor chip via the second emission region, and a main emission direction of the radiation emerging via the second emission region is parallel to the main emission direction of the radiation emerging via the first emission region.

4. The radiation-emitting semiconductor chip as claimed in claim 3, wherein the reflector surface together with the active layer form a setting angle of between 40° and 44° inclusive, and the further reflector surface together with the active layer form a further setting angle of between 47° and 51° inclusive.

5. The radiation-emitting semiconductor chip as claimed in claim 1, wherein the top surface comprises a reflection region, the semiconductor chip is configured such that radiation reflected by the further reflector during operation is reflected back in a direction of the further reflector in the reflection region.

6. The radiation-emitting semiconductor chip as claimed in claim 5, wherein the further reflector surface together with the active layer form a further setting angle of between 42° and 47° inclusive.

7. The radiation-emitting semiconductor chip as claimed in claim 1, wherein the first emission region of the top surface is formed by an antireflection region, which is configured to transmit at least 99% of the radiation impinging on it from a direction of the reflector during operation.

8. The radiation-emitting semiconductor chip as claimed in claim 3, wherein the second emission region of the top surface is formed by an antireflection region, which is configured to transmit at least 99% of the radiation impinging on it from a direction of the further reflector during operation.

9. The radiation-emitting semiconductor chip as claimed in claim 1, wherein an absorption structure is arranged at a side of the active layer situated opposite the reflector, said absorption structure being configured to absorb radiation generated in the active layer during operation.

10. The radiation-emitting semiconductor chip as claimed in claim 1, wherein the semiconductor chip is a superluminescence diode chip.

11. The radiation-emitting semiconductor chip as claimed in claim 1, wherein the semiconductor chip is a laser diode chip.

12. A rear light for a motor vehicle, which comprises at least one radiation-emitting semiconductor chip as claimed in claim 1.

13. A motor vehicle having a rear window and a rear light as claimed in claim 12, wherein the rear light is arranged on or in the rear window, electromagnetic radiation emitted by the semiconductor chip of the rear light during operation is emitted parallel or antiparallel to a travel direction of the motor vehicle.

14. An optical distance measurement device for determining a distance to an object, which device comprises a radiation-emitting semiconductor chip as claimed in claim 11.

* * * * *